United States Patent [19]

Hatano et al.

[11] Patent Number: 5,042,043
[45] Date of Patent: Aug. 20, 1991

[54] SEMICONDUCTOR LASER USING FIVE-ELEMENT COMPOUND SEMICONDUCTOR

[75] Inventors: Ako Hatano; Toshihide Izumiya, both of Tokyo; Yasuo Ohba, Yokohama, all of Japan

[73] Assignee: Kabushiki Kaisha Toshiba, Kawasaki, Japan

[21] Appl. No.: 508,694

[22] Filed: Apr. 13, 1990

[30] Foreign Application Priority Data

Apr. 28, 1989 [JP] Japan ................... 1-110502

[51] Int. Cl.$^5$ .............................................. H01S 3/19
[52] U.S. Cl. ........................................ 372/45; 372/46
[58] Field of Search ............................. 372/45, 46, 43

[56] References Cited

U.S. PATENT DOCUMENTS

| | | | |
|---|---|---|---|
| 4,792,958 | 12/1988 | Ohba et al. | 372/45 |
| 4,809,287 | 2/1989 | Ohba et al. | 372/45 |
| 4,835,117 | 5/1989 | Ohba et al. | 437/129 |
| 4,881,235 | 11/1989 | Chinone et al. | 372/45 |
| 4,910,743 | 3/1990 | Ohba et al. | 372/45 |
| 4,949,349 | 6/1990 | Ohba et al. | 372/45 |
| 4,961,197 | 10/1990 | Tanaka et al. | 372/45 |

FOREIGN PATENT DOCUMENTS 54-5273 3/1979 Japan .

OTHER PUBLICATIONS

Electronics Letters, Sep. 26, 1985, vol. 21, No. 20, pp. 903–905, L. J. Mawst et al; "Complementary Self-Aligned Laser by Metalorganic Chemical Vapour Deposition".

Extended Abstracts of the 19th Conference on Solid State Devices and Materials, Tokyo Aug. 25–27 1987, pp. 115–118, M. Ishikawa et al, "High Power Operation on InGaP/InAlP Transverse Mode Stabilized Laser Diodes".

Primary Examiner—Georgia Epps
Attorney, Agent, or Firm—Oblon, Spivak, McClelland, Maier & Neustadt

[57] ABSTRACT

A green light-emitting semiconductor laser using a superlattice layer wherein BP layers and $Ga_xAl_{1-x}N$ ($0 \leq x \leq 1$) layers are alternately stacked and each of the $Ga_xAl_{1-x}N$ ($0 \leq x \leq 1$) layers has a zinc blende type crystal structure, or a $Ga_xAl_yB_{1-x-y}N_zP_{1-z}$ ($0 \leq x, y, z \leq 1$) mixed crystal layers with a zinc blende type structure a first clad layer of a first conductivity type, an active layer, and a second clad layer of a second conductivity type, together constituting a double heterojunction.

16 Claims, 17 Drawing Sheets

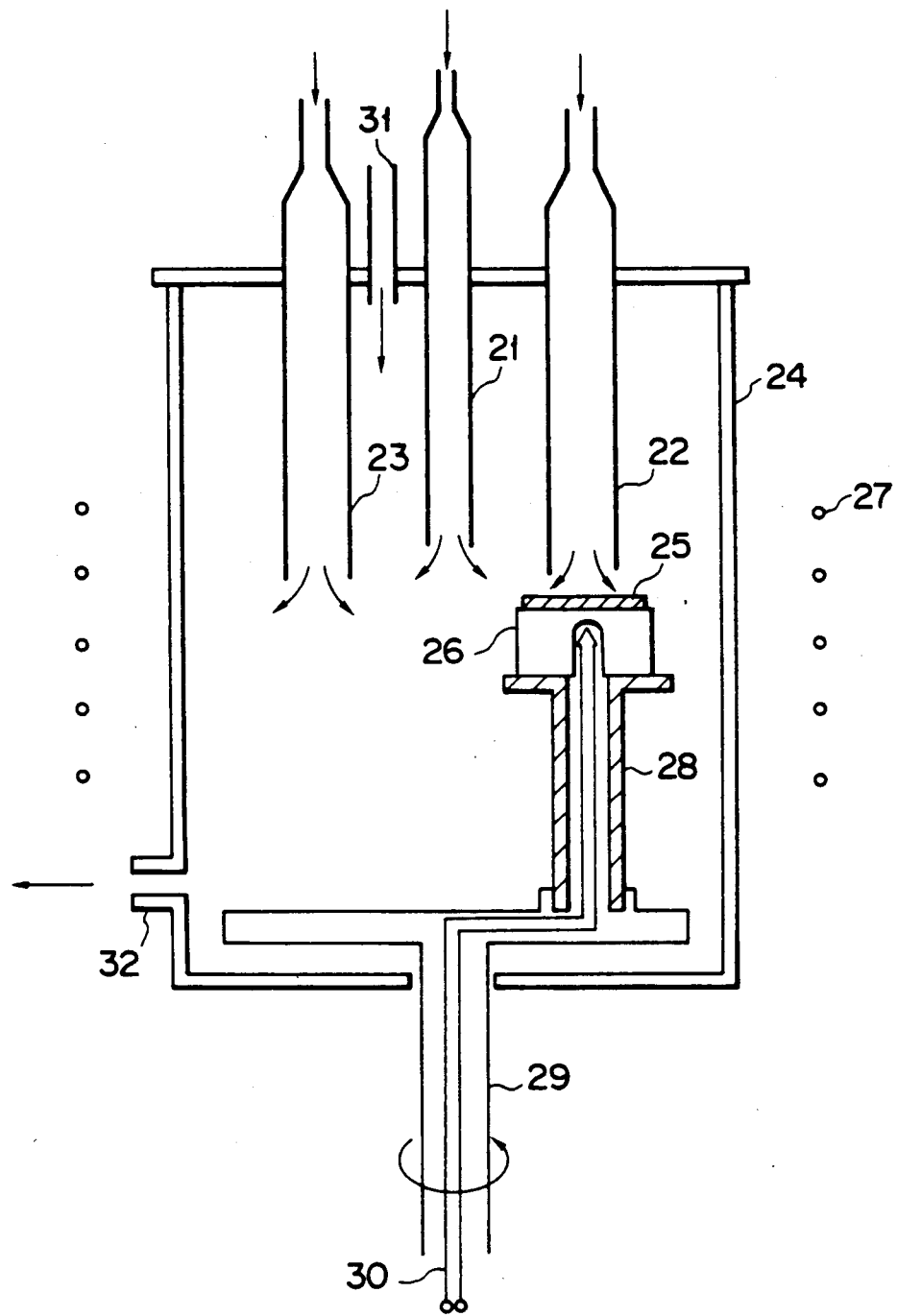
F I G. 2

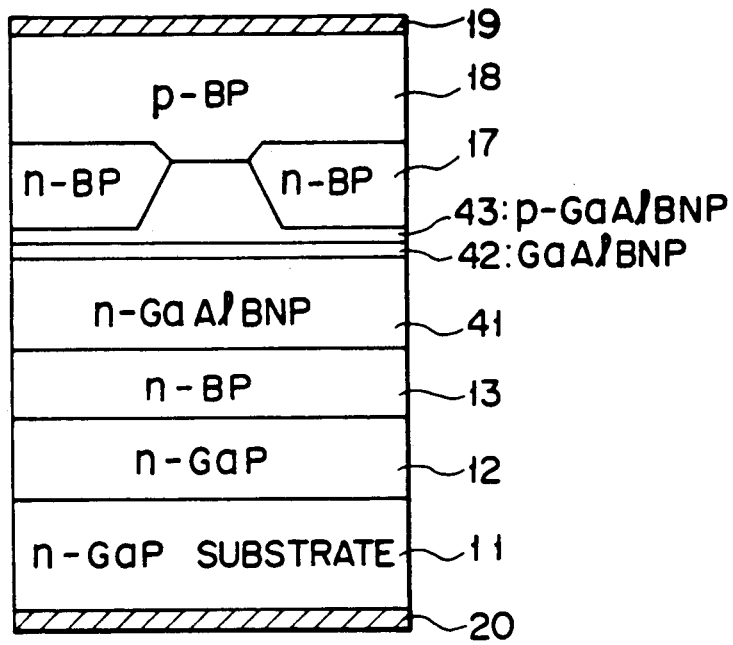
F I G. 4
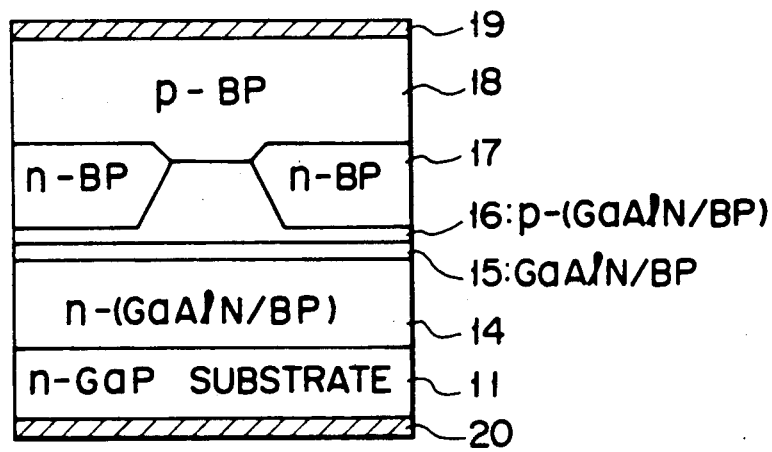
F I G. 5

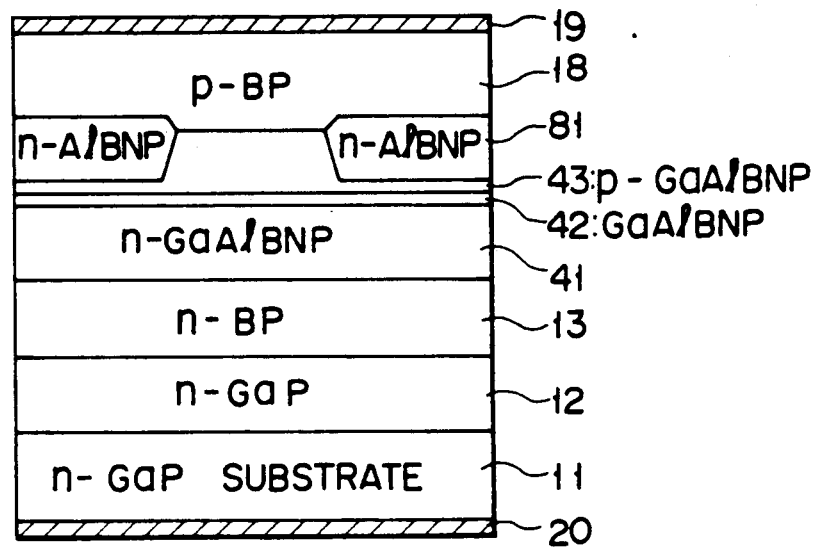
F I G. 10
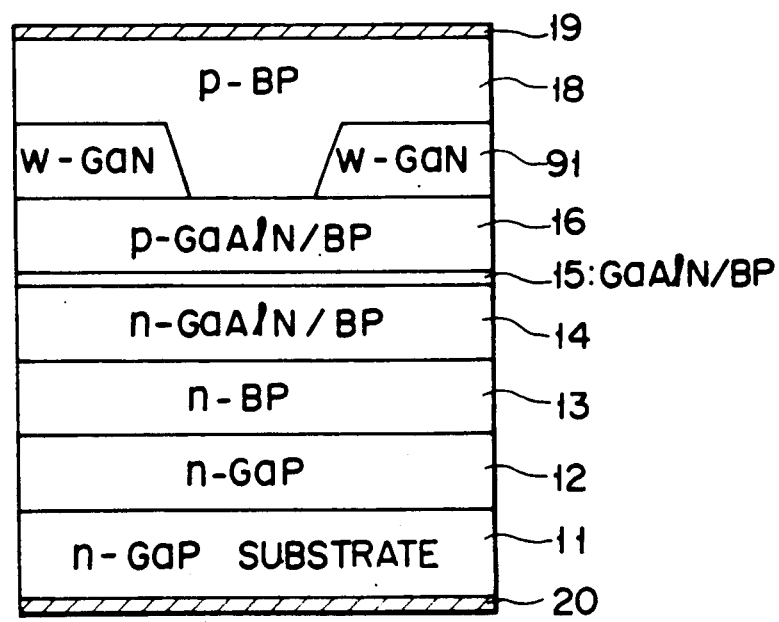
F I G. 11

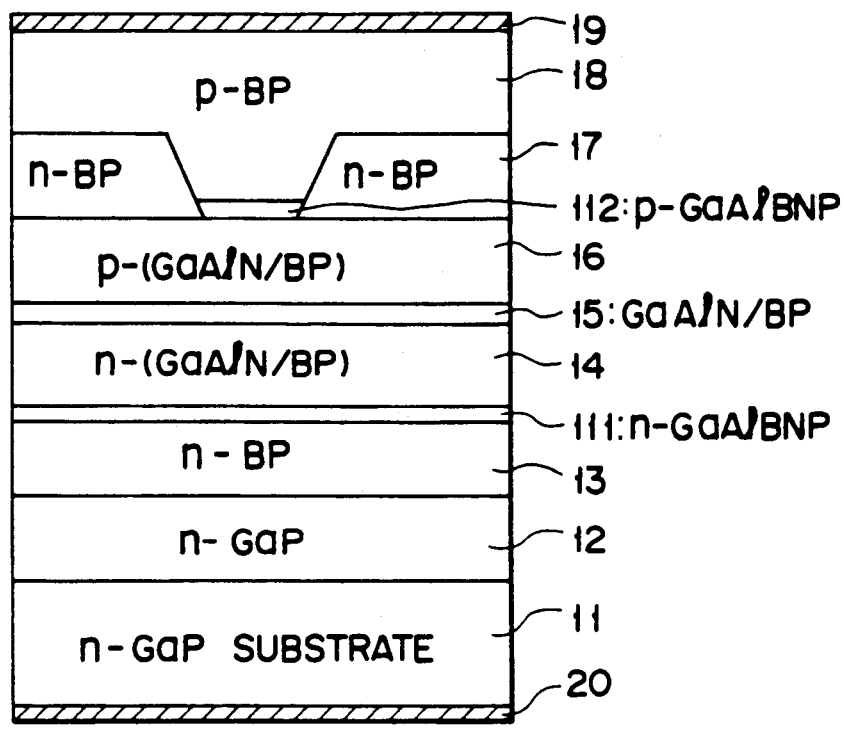
F I G. 16
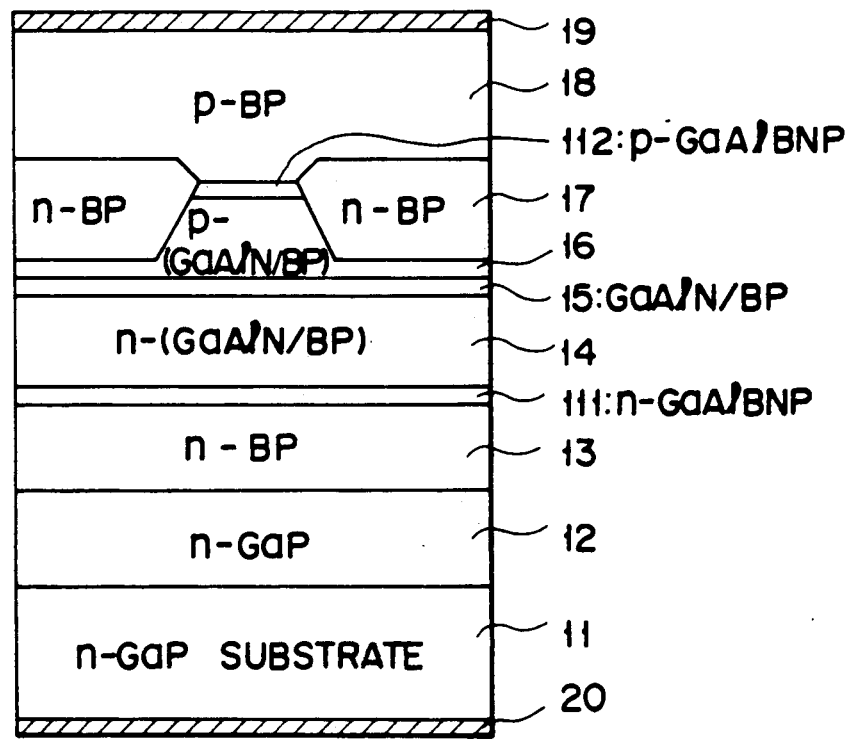
F I G. 17

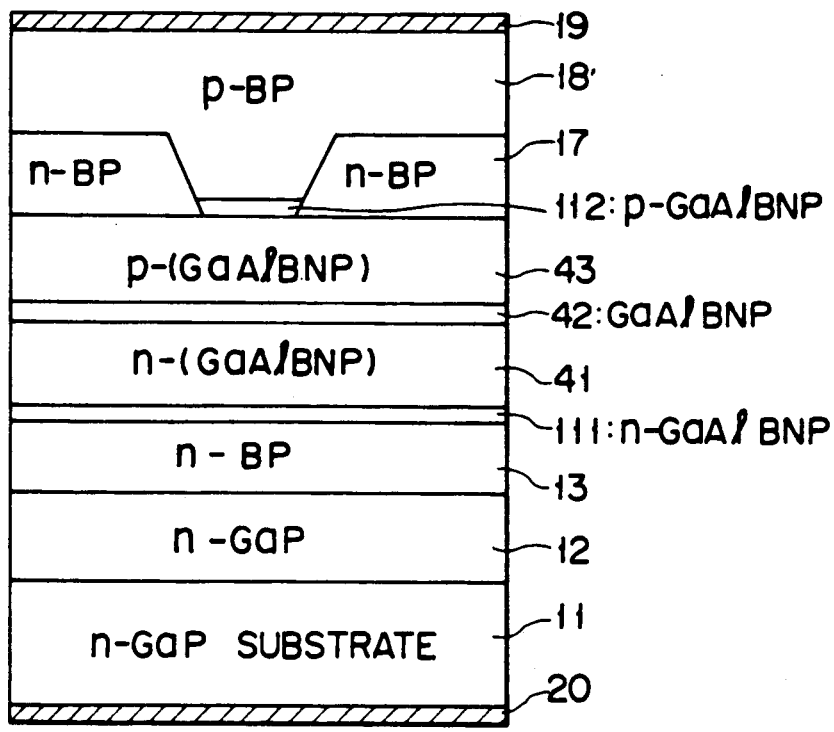
F I G. 20
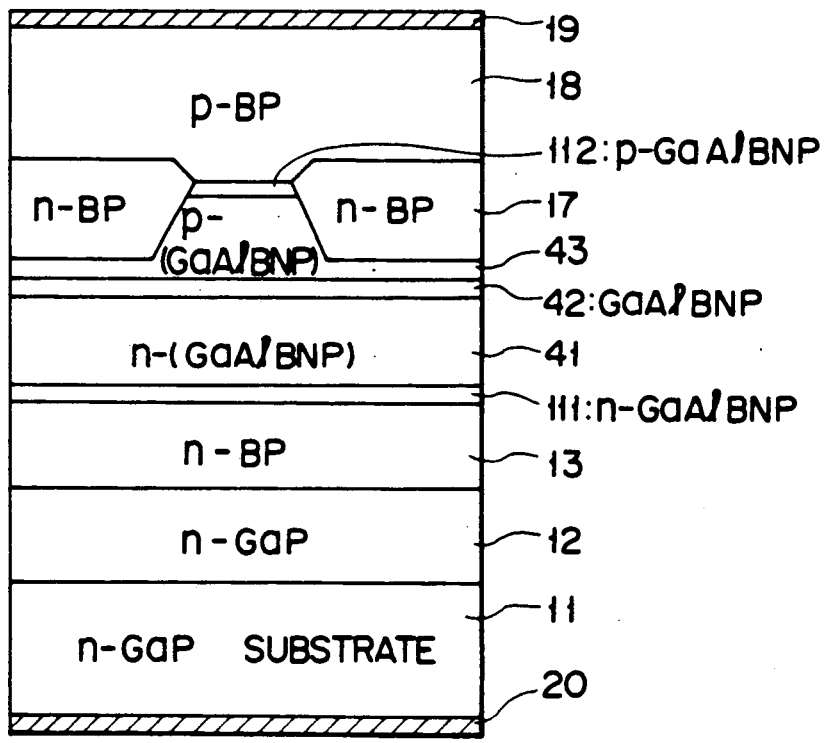
F I G. 21

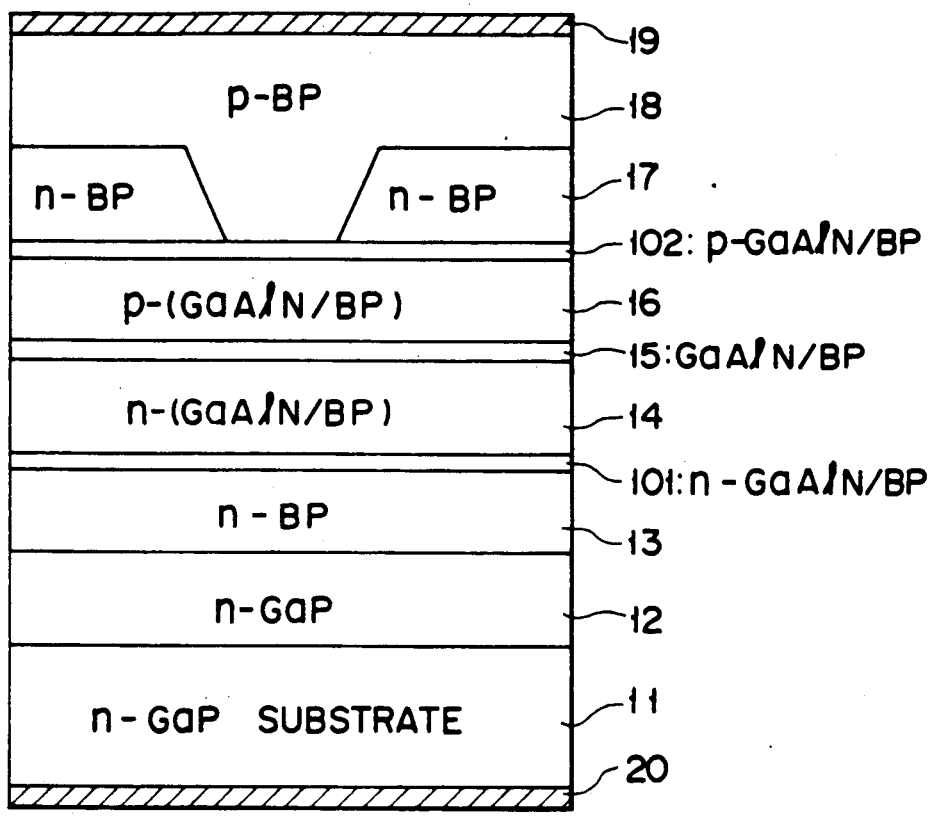
F I G. 22
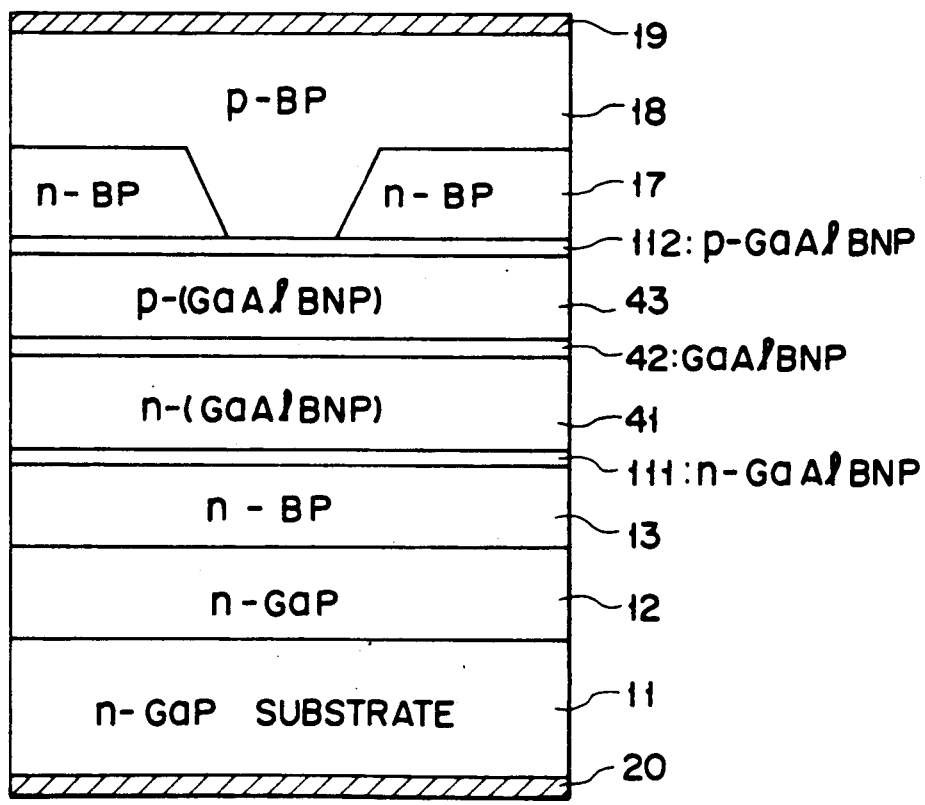
F I G. 23

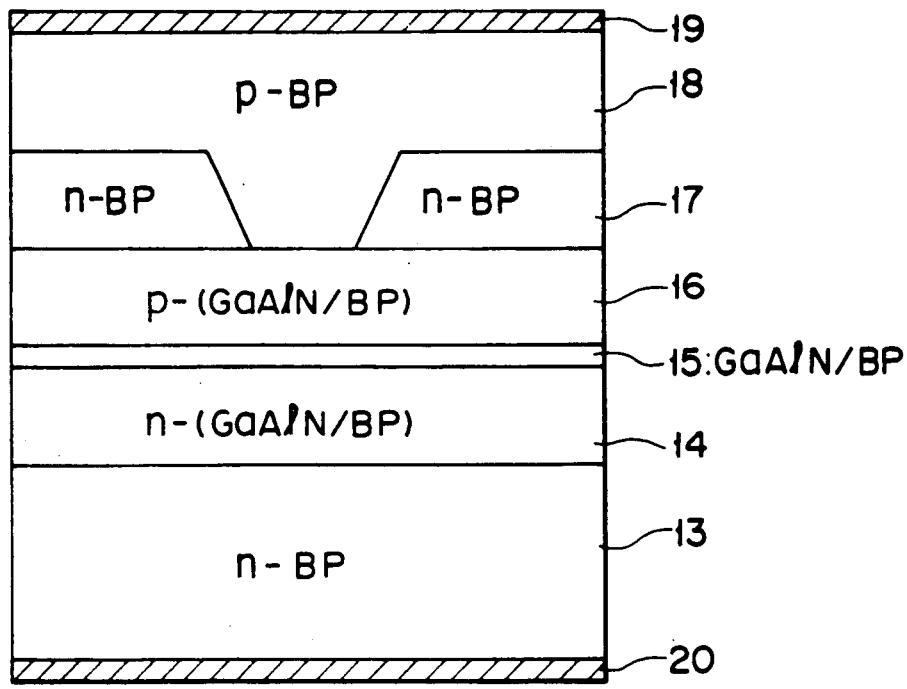
F I G. 24
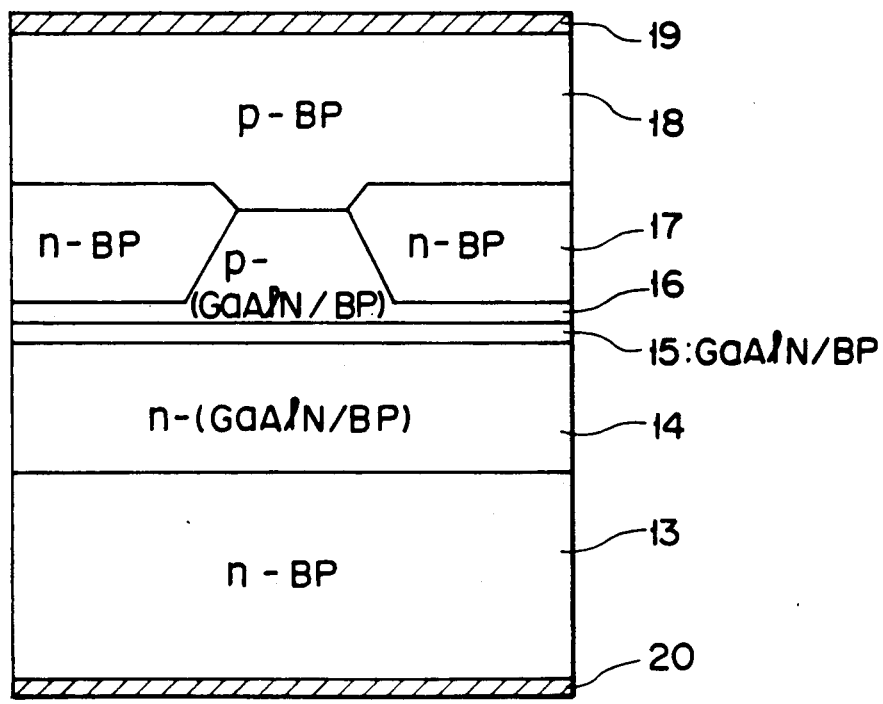
F I G. 25

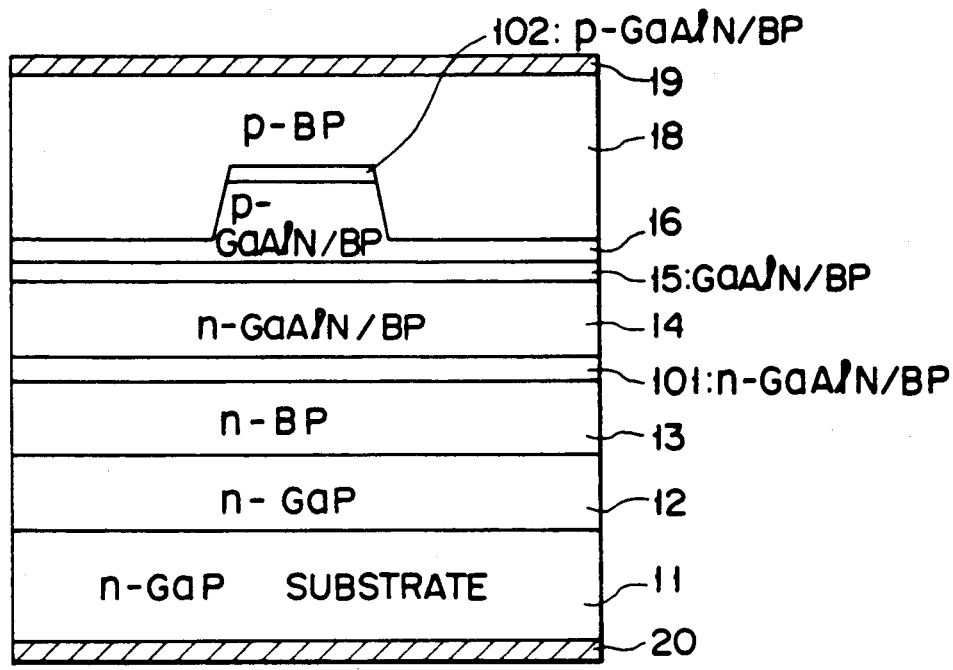
F I G. 27
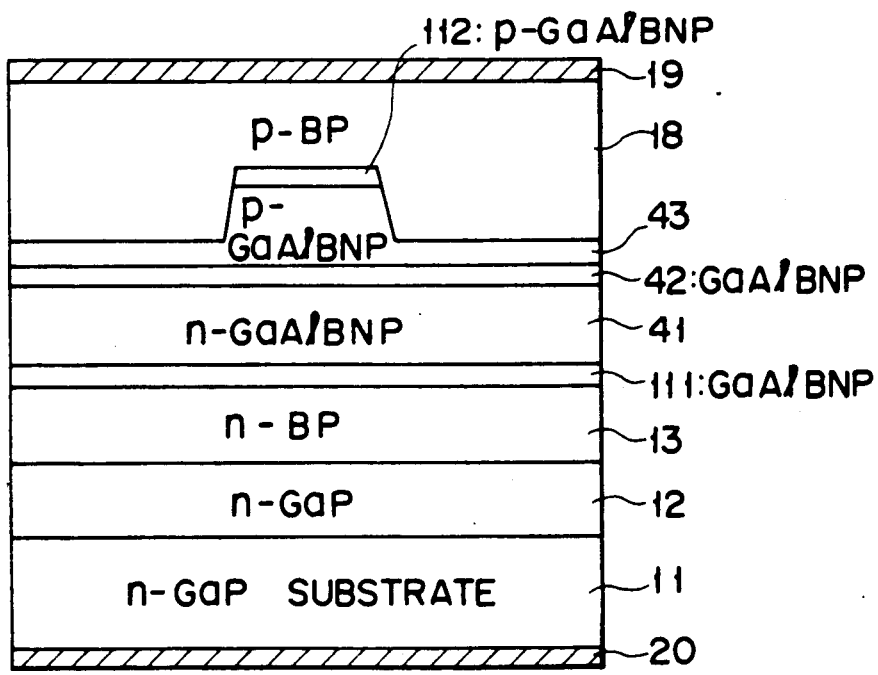
F I G. 28

SEMICONDUCTOR LASER USING FIVE-ELEMENT COMPOUND SEMICONDUCTOR

BACKGROUND OF THE INVENTION

1. Field of the Invention

The present invention relates to a shortwave semiconductor laser using a new Group III-V compound semiconductor material.

2. Description of the Related Art

As a consequence of the development of high-speed and high-density information processing systems, demand has arisen for the realization of a shortwave green-light semiconductor laser (LD).

Group III-V compound semiconductor materials having a wide band gap considered to be most suitable for realizing a green semiconductor laser include nitrides and phosphides of light Group III elements such as BN (4 or 8 eV), AlN (6 eV), GaN (3.4 eV), InP (2.4 eV), AlP (2.5 eV), and GaP (2.3 and 2.8 eV). However, it is difficult to synthesize a high pressure phase (c-BN) having an sp3 bonding by using BN although BN has a sufficiently wide band gap. Furthermore, it is difficult to perform impurity doping by using BN. In addition, BN has three different polymorphisms and tends to form a mixture. For the above reasons, therefore, BN is not suitable. InN has an insufficiently wide band gap for the realization of a green laser and poor thermal stability. In addition, only a polycrystal can be normally obtained by using InN. The band gap of each of AlP and GaP is slightly insufficient. AlN and GaN both have sufficiently wide band gap and good stability and therefore are suitable for shortwave light emission. However, the crystal structure of AlN and GaN is of a Wurzeite type (to be referred to as a WZ type hereinafter) and has high ionicity. Because of this, lattice defects easily occur, and thus a low-resistance p-type semiconductor cannot be obtained.

With the aim of overcoming the above drawbacks, attempts have been made to obtain a material having a wide band gap by mixing B and N with a Group III-V compound semiconductor which does not contain either of these materials. However, the lattice constant of a conventional III-V compound semiconductor material differs from that of the material containing B and N by as much as 20% to 40% and both materials also have different crystal structures. As a result, a stable crystal cannot be obtained. For example, in order to mix N in GaP, the mixing ratio of N to GaP was 1% or less. Consequently, a sufficiently wide band gap cannot be obtained.

According to studies carried out by the present inventors, a low-resistance p-type crystal cannot be obtained by use of GaN or AlN essentially because due to their high ionicity, a defect can easily occur and because the crystal structure of GaN and AlN is not a Zinc Blende type (to be referred to as a ZB type hereinafter) but rather a WZ structure.

As described above, no conventional semiconductor material satisfies the requirements for realizing a green semiconductor laser, i.e., a wide band gap of, for example, 2.7 eV, p and n conductivity type control, and good crystal quality. Although a nitride such as AlN or GaN is a suitable material for obtaining a wide band gap, a low-resistance p-type layer cannot be obtained therefrom.

SUMMARY OF THE INVENTION

Accordingly, it is an object of the present invention to provide a green semiconductor laser by use of a new five-element Group III-V compound semiconductor material.

In order to achieve the above object, a semiconductor laser according to the present invention comprises:

a substrate;

a first clad layer, of a first conductivity type, formed on the substrate directly or via a buffer layer and constituted by a superlattice layer wherein BP layers and $Ga_xAl_{1-x}N$ ($0 \leq x \leq 1$) layers are alternately stacked and each of the $Ga_xAl_{1-x}N$ ($0 \leq x \leq 1$) layers has a zinc blende type crystal structure;

an active layer formed on the first clad layer and constituted by a superlattice layer wherein BP layers and $Ga_xAl_{1-x}N$ ($0 \leq x \leq 1$) layers are alternately stacked and each of the $Ga_xAl_{1-x}N$ ($0 \leq x \leq 1$) layers has a zinc blende type crystal structure; and a second clad layer, of a second conductivity type, formed on the active layer and constituted by a superlattice layer wherein BP layers and $Ga_xAl_{1-x}N$ ($0 \leq x \leq 1$) layers are alternately stacked and each of the $Ga_xAl_{1-x}N$ ($0 \leq x \leq 1$) layers has a zinc blende type crystal structure.

Alternatively, a semiconductor laser according to the present invention comprises:

a substrate;

a first clad layer, of a first conductivity type, formed on the substrate directly or via a buffer layer and consisting of a $Ga_xAl_yB_{1-x-y}N_zP_{1-z}$ ($0 \leq x, y, z \leq 1$) mixed crystal layer having a ZB type crystal structure;

an active layer formed on the first clad layer and consisting of a $Ga_xAl_yB_{1-x-y}N_zP_{1-z}$ ($0 \leq x, y, z \leq 1$) mixed crystal layer having a ZB type crystal structure; and a second clad layer, of a second conductivity type, formed on the active layer and consisting of a $Ga_xAl_yB_{1-x-y}N_zP_{1-z}$ ($0 \leq x, y, z \leq 1$) mixed crystal layer having a ZB type crystal structure.

On the basis of extensive studies carried out by the present inventors, it has been found that if a crystal originally having a WZ structure is grown on a crystal having a stable ZB structure, the ZB structure is maintained to a certain thickness. For this reason, the present invention employs a multilayered structure (superlattice) obtained by alternately stacking a plurality $Ga_xAl_{1-x}N$ ($0 \leq x \leq 1$) layers and BP layers having substantially the same bond lengths, a ZB structure, and low ionicity, and which permits ease of p and n conductivity type control. The resulting superlattice layer is a compound semiconductor material of a ZB structure having properties of $Ga_xAl_{1-x}N$—i.e., it is a direct transition type and has a wide band gap—and properties of BP—i.e., it has a low ionicity, and thus a defect is less likely to occur. By using this semiconductor material to constitute a double heterojunction portion, a green semiconductor laser can be realized.

It has been conventionally held that a thermodynamically stable III-V mixed compound semiconductor materials cannot be obtained when combinations of III group elements, i.e., B and Ga, Al or In, or combinations of V group elements, i.e., N and P or As are included. On the basis of to other studies carried out by the present inventors, it was found that when relatively large amounts of B and N are mixed at the same time, a stable mixed crystal can often be obtained by using the above combinations. When this mixed crystal is observed by a transmission electron microscope, an ordering in which selective bonds of Ga—N and B—P are alternately aligned is found. That is, it is found that since Ga—N and B—P bonds are produced, the total energy of the mixed crystal is reduced and render it stable. From this, it should be apparent that in order to obtain a stable mixed crystal, the lattice constants or lattice types do not have to be the same; however, it is important that bond lengths be substantially equal to each other. A semiconductor laser according to the present invention, therefore, a double heterojunction portion constituted by using a compound semiconductor material in which, in a $Ga_xAl_yB_{1-x-y}N_zP_{1-z}$ mixed crystal, a composition is preferably $x+y\sim z$ and an ordering of B—P and Ga—N or Al—N is structurally produced. With this arrangement also, a green semiconductor laser can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

FIG. 2 is a view showing an arrangement of an MOCVD apparatus used to manufacture the semiconductor laser shown in FIG. 1;

FIG. 4 is a sectional view showing a semiconductor laser according to still another embodiment using a $Ga_xAl_yB_{1-x-y}N_zP_{1-z}$ mixed crystal layer;

FIG. 5 is a sectional view showing a semiconductor laser according to still another embodiment from which a buffer layer is omitted;

FIGS. 8 to 10 are sectional views each showing a semiconductor laser according to still another embodiment using an $Al_uB_{1-u}N_vP_{1-v}$ layer as a current blocking layer;

FIGS. 11 to 13 are sectional views each showing a semiconductor laser according to still another embodiment using a GaN layer as a current blocking layer;

FIGS. 14 to 17 are sectional views each showing a semiconductor laser according to still another embodiment in which intermediate buffer layers are formed on the upper and lower surfaces of a clad layer;

FIGS. 18 to 21 are sectional views each showing a semiconductor laser according to still another embodiment in which intermediate buffer layers are formed on the upper and lower surfaces of a clad layer;

FIGS. 22 and 23 are sectional views showing semiconductor lasers according to other embodiments in which the arrangements shown in FIGS. 14 and 18, respectively, are slightly modified;

FIGS. 24 to 26 are sectional views each showing a semiconductor laser according to still another embodiment from which a substrate is removed;

FIGS. 27 to 29 are sectional views each showing a semiconductor laser according to still another embodiment from which an n-type current blocking layer is omitted.

DETAILED DESCRIPTION OF THE PREFERRED EMBODIMENTS

Figure 1:
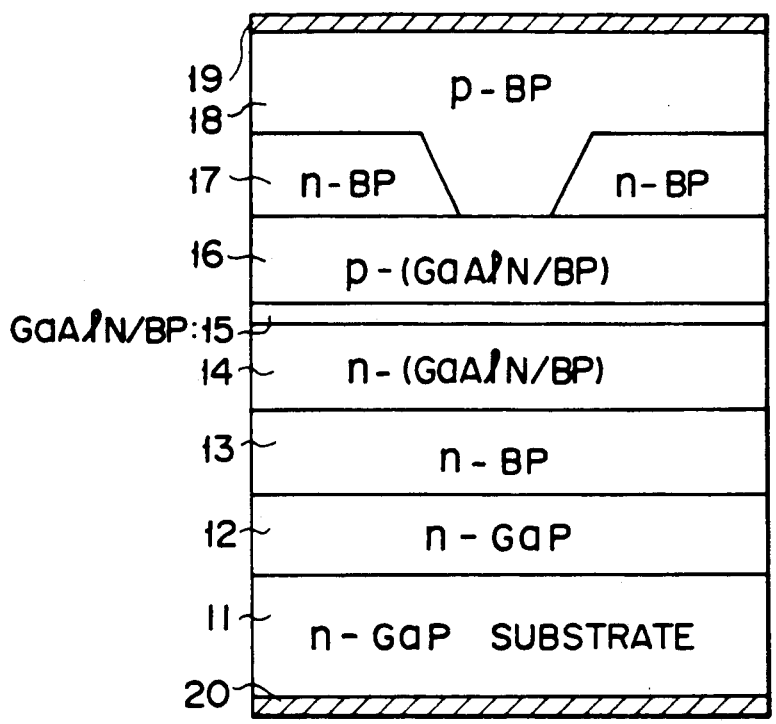
FIG. 1 is a sectional view showing a semiconductor laser using a $Ga_xAl_{1-x}N/BP$ superlattice layer according to an embodiment of the present invention.

FIG. 1 is a sectional view showing a green semiconductor laser according to an embodiment of the present invention. In FIG. 1, a composition ratio of each semiconductor layer is not shown. This will apply to all the drawings.

Referring to FIG. 1, an n-type GaP buffer layer 12 and an n-type BP buffer layer 13 are stacked on an n-type GaP substrate 11. A first clad layer 14 consisting of an n-type $Ga_xAl_{1-x}N/BP$ superlattice layer, an active layer 15 consisting of an undoped $Ga_xAl_{1-x}N/BP$ $Ga_xAl_{1-x}N/BP$ superlattice layer, and a second clad layer 16 consisting of a p-type $Ga_xAl_{1-x}N/BP$ superlattice layer are sequentially stacked on the n-type BP buffer layer 13. A composition ratio of the active layer 15 is set to be different from that of the first and second clad layers 14 and 16, so that a double heterojunction in which a band gap of the active layer 15 is narrower than that of the first and second clad layers 14 and 16 is constituted. For example, assume that $x=0.4$ in the clad layers 14 and 16 while $x=0.5$ in the active layer 15. In this case, the band gap of the clad layers 14 and 16 is 3.0 eV while that of the active layer 15 is 2.7 eV, thereby forming a double heterojunction. An n-type BP current blocking layer 17 is selectively formed outside a stripe portion at a central portion serving as a current path on the p-type clad layer 16. A p-type BP contact layer 18 is formed on the current blocking layer 17 and the stripe p-type clad layer 16. A p-side metal electrode 19 is formed on the surface of the contact layer 18, while an n-side metal electrode 20 is formed on the substrate 11. In this semiconductor laser, the n-type BP current blocking layer 17 is formed around a lower projecting portion of the contact layer 18, thereby forming a current blocking structure and an optical guide structure in a self-alignment manner.

This semiconductor laser is manufactured by using a metal organic chemical vapor deposition (MOCVD) method. This manufacturing method will be described in detail below.

FIG. 2 shows a metal organic chemical vapor deposition (MOCVD) apparatus having a plurality of reaction tubes, used in the above embodiment. Quartz reaction tubes 21, 22, and 23 are vertically mounted on a chamber 24 to extend through its upper cover. Necessary source gases are supplied in the chamber 24 from gas inlet ports of the tubes 21, 22, and 23. A substrate 25 is placed on a graphite susceptor 26 to oppose the openings of the tubes 21, 22, and 23. The susceptor 26 is mounted on a quartz holder 28 connected to a driving shaft 29. The shaft 29 is sealed by a magnetic fluid seal and extends through the bottom of the chamber 24. The susceptor 26 is driven by a motor (not shown) controlled by an externally installed computer. That is, the susceptor 26 which is driven by the shaft 29 can move circularly at high speed under the tubes 21, 22, and 23 arranged on the circumference of the circular motion. An RF coil 27 for heating the substrate 25 is located outside the chamber 24. A thermocouple 30 is arranged at a central portion of the susceptor 26 to measure a temperature immediately below the substrate 25. A slip ring is used as a cord portion of the thermocouple 30 in order to prevent distortion due to rotation. A reaction gas is pushed by a fast down-flow of hydrogen gas from an upper injection port 31 and exhausted from an exhaust port 32 by a rotary pump while mixing of the two gases is minimized.

By using the MOCVD apparatus having the above arrangement, desired source gases are flowed through the reaction tubes 21, 22, and 23, and the substrate 25 is moved by the computer-controlled motor, thereby manufacturing a multilayered structure having an arbitrary stacking period and an arbitrary composition on the substrate 25. In this system, a sharp concentration change not obtained by a gas switching system can be easily realized. In addition, in this system, gases need not be switched at high speed in order to manufacture a steep hetero interface. Therefore, a problem of a low decomposition rate of a source gas such as $NH_3$ or $PH_3$ can be solved by setting a low gas flow rate.

The semiconductor laser shown in FIG. 1 was manufactured by using the above MOCVD apparatus. The source gases were trimethylaluminum (TMA), trimethylgallium (TMG), triethylboron (TEB), ammonia ($NH_3$), and phosphine ($PH_3$). The substrate temperature was 850° C. to 1,150° C., the chamber inner pressure was 0.3 atm., the total flow rate of source gases was 1 l/min, and the gas flow rate was set to obtain a growth rate of 1 μm/h. Schematical gas flow rates were such that TMA: $1 \times 10^{-6}$ mol/min, TMG: $1 \times 10^{-6}$ mol/min, TEB: $1 \times 10^{-6}$ mol/min, $PH_3$: $5 \times 10^{-4}$ mol/min, and $NH_3$: $1 \times 10^{-3}$ mol/min. Mg and Si were used as p- and n-type dopants, respectively. Doping of these impurities was performed by mixing silane ($SiH_4$) and cyclopentadienylmagnesium ($CP_2Mg$) in source gases.

In order to form a $Ga_xAl_{1-x}N/BP$ superlattice, a typical stacking period is 20 Å, and a typical thickness ratio of a $Ga_xAl_{1-x}N$ layer to a BP layer is 1:1. Therefore, these values were set in all the embodiments to be described below. Although another composition may be used, if a film thickness ratio of the $Ga_xAl_{1-x}N$ layer to the BP layer of a double heterojunction portion, a band structure changes from a direct transition type to an indirect transition type, thereby reducing light emission efficiency. In addition, although the stacking cycle is not limited to the above value, if it exceeds 50 Å, holes are significantly localized to reduce a conductivity. Therefore, the stacking cycle is preferably set to be 50 Å or less.

Formation conditions of the device shown in FIG. 1 will be described in detail below. The Si-doped GaP substrate 11 and has a carrier concentration of $1 \times 10^{18}/cm^3$. The Si-doped n-type GaP buffer layer 12 having a carrier concentration of $1 \times 10^{18}/cm^3$ and a thickness of 1-μm is formed on the substrate 11, and the Si-doped n-type BP buffer layer 13 having a carrier concentration of b $1 \times 10^{17}/cm^3$ and a thickness of 1 μm is subsequently formed thereon. An Si-doped $Ga_{0.4}Al_{0.6}N/BP$ superlattice layer having a carrier concentration of $1 \times 10^{17}/cm^3$ and a thickness of 1 μm is formed as the n-type first clad layer 14 on the BP buffer layer 13, an undoped $Ga_{0.5}Al_{0.5}N/BP$ superlattice layer having a thickness of 0.1 μm is formed as the active layer 15, and an Mg-doped $Ga_{0.4}Al_{0.6}N/BP$ superlattice layer having a carrier concentration of $1 \times 10^{17}/cm^3$ and a thickness of 1 μm is formed as the p-type second clad layer 16. As a result, a double heterojunction structure is obtained.

The p-type BP current blocking layer 17 is selectively formed on the p-type second clad layer 16. More specifically, an $SiO_2$ film (not shown) having a 5-μm wide stripe pattern is formed on the second clad layer 16 by thermal decomposition of silane gas and photolithography. The n-type BP current blocking layer 17 is selectively formed only on the exposed clad layer 16 by the MOCVD method. The current blocking layer 17 is Si-doped and has a carrier concentration of $1 \times 10^{17}/cm^3$ and a thickness of 1 μm. Thereafter, the $SiO_2$ film is removed, and the p-type BP contact layer 18 (Mg-doped, carrier concentration = $1 \times 10^{17}/cm^3$ and thickness = 1 μm). The electrode 19 consisting of Au/Zn is formed on the contact layer 18 by a normal electrode formation step, and the electrode 20 consisting of Au/Ge is formed on the lower surface of the substrate.

The semiconductor laser wafer obtained as described above was cleaved to constitute a laser device having a cavity length of 300 μm. It was confirmed that this laser device performed green laser oscillation by a pulse operation having a pulse width of 100 μsec at a liquid nitrogen temperature. The threshold current density of laser oscillation was about 50 kA/cm$^2$.

Figure 3:
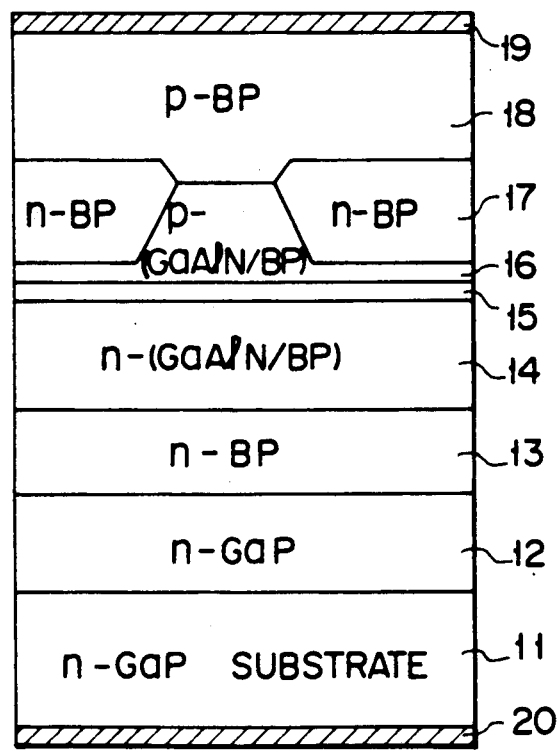
FIG. 3 is a sectional view showing a semiconductor laser according to another embodiment using a $Ga_xAl_{1-x}N/BP$ superlattice layer.

FIG. 3 shows a green semiconductor laser according to another embodiment of the present invention obtained by modifying the arrangement shown in FIG. 1. The arrangement shown in FIG. 3 is the same as that shown in FIG. 1 except that a p-type second clad layer 16 is selectively etched to form a stripe-like projecting portion on its central portion and a current blocking layer 17 consisting of an n-type BP layer is formed around the projecting portion.

In this embodiment, since the second clad layer 16 is formed to have the projecting portion, a refractive index difference is formed equivalently in a transverse direction. As a result, good transverse mode control is performed. Also in this embodiment, a laser device having a cavity length of 300 μm was constituted to obtain substantially the same characteristics. The threshold current density of laser oscillation was about 70 kA/cm$^2$. Although the threshold current density was slightly high, a far field pattern having a single peak was confirmed, i.e., good transverse mode control was performed.

FIG. 4 shows a semiconductor laser according to still another embodiment in which a $Ga_xAl_yB_{1-x-y}N_zP_{1-z}$ mixed crystal layer is used instead of a GaAlN/BP superlattice layer to form a double heterojunction portion. That is, the arrangement shown in FIG. 4 is the same as that shown in FIG. 3 except that a $Ga_xAl_yB_{1-x-y}N_zP_{1-z}$ mixed crystal layer, an undoped $Ga_xAl_yB_{1-x-y}N_zP_{1-z}$ mixed crystal layer, and a $Ga_xAl_yB_{1-x-y}N_zP_{1-z}$ mixed crystal layer are used as an n-type first clad layer 41, an active layer 42, and a p-type second clad layer 43, respectively. Since a mixed crystal composition of the first and second clad layers 41 and 43 differs from that of the active layer 42, different band gaps are obtained to constitute a double heterojunction.

This semiconductor laser is manufactured following substantially the same procedures as in each of the above embodiments by using the MOCVD apparatus shown in FIG. 2. In the manufacture, the movement of a substrate is stopped upon formation of the mixed crystal layers, and all necessary source gases are introduced from a single reaction pipe. In addition, in order to prevent a mutual reaction between the reaction gases, the source gases for mixed crystal growth are mixed immediately before the reaction pipe, and the growth is performed at a low pressure. Growth conditions such as the source gases, the flow rates of the source gases, and the substrate temperature are substantially the same as those in the above embodiments.

The detailed device formation conditions are as follows. That is, the n-type GaP substrate 11 is Si-doped and has a carrier concentration of $1 \times 10^{18}/cm^3$, the n-type GaP buffer layer 12 is Si-doped and has a carrier concentration of $1 \times 10^{18}/cm^3$ and a thickness of 1 μm, and the n-type BP layer 13 is Si-doped and has a carrier concentration of $1 \times 10^{17}/cm^3$ and a thickness of 1 μm. The n-type first clad layer 41, the active layer 42, and the p-type second clad layer 43 are a $Ga_{0.2}Al_{0.3}B_{0.5}N_{0.5}P_{0.5}$ mixed crystal layer (Si-doped, carrier concentration = $1 \times 10^{17}/cm^3$ and thickness = 1 μm), an undoped $Ga_{0.25}Al_{0.25}B_{0.5}N_{0.5}P_{0.5}$ mixed crystal (thickness = 0.1 μm), and a $Ga_{0.2}Al_{0.3}B_{0.5}N_{0.5}P_{0.5}$ mixed crystal layer (Mg-doped, carrier concentration = $1 \times 10^{17}/cm^3$ thickness = 1 μm). Although a current blocking structure, an optical wave, and electrodes are the same as those in the embodiment shown in FIG. 3, they may be the same as those in the embodiment shown in FIG. 1.

The obtained laser wafer was cleaved to form a laser device having a cavity length of 300 μm. As a result, green laser oscillation was confirmed by a pulse operation having a pulse width of 20 μm at a liquid nitrogen temperature.

FIG. 5 shows still another embodiment of the present invention. This embodiment has the same arrangement as that of the embodiment shown in FIG. 3 except that buffer layers 12 and 13 between a substrate 11 and a double heterojunction portion are omitted. That is, the buffer layers are not essential but can be omitted as needed.

The present invention, however, has a problem in that no suitable substrate is present so as to have the same lattice constant as that of the semiconductor material of the double heterojunction portion of the semiconductor laser. For this reason, a large stress acts on the double heterojunction portion in accordance with growth conditions, or a dislocation occurs due to a lattice constant difference, resulting in a problem of reliability. In view of this, substrate buffer layers are preferably formed. Still another embodiment of the present invention in which the problem of lattice constant is further taken into consideration will be described below.

Figure 6:
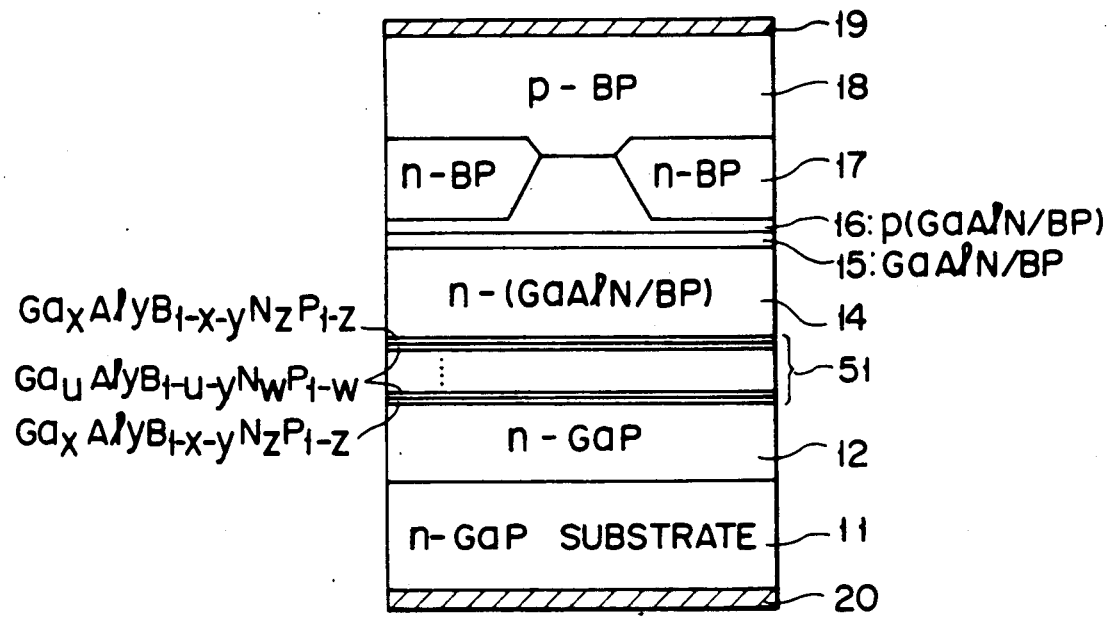
FIG. 6 is a sectional view showing a semiconductor laser according to still another embodiment using a $Ga_xAl_{1-x}N/BP$ superlattice layer as a buffer layer.

FIG. 6 shows a semiconductor laser according to such an embodiment. This embodiment has the same arrangement as that of the embodiment shown in FIG. 3 except that a portion of the n-type BP buffer layer 13 is substituted by an n-type buffer layer 51 having a $Ga_xAl_yB_{l-x-y}N_zP_{l-z}$ mixed crystal layer having a different composition. A $Ga_xAl_{l-x}N/BP$ superlattice layer having a different composition may be used as the n-type buffer layer 51.

Figure 7:
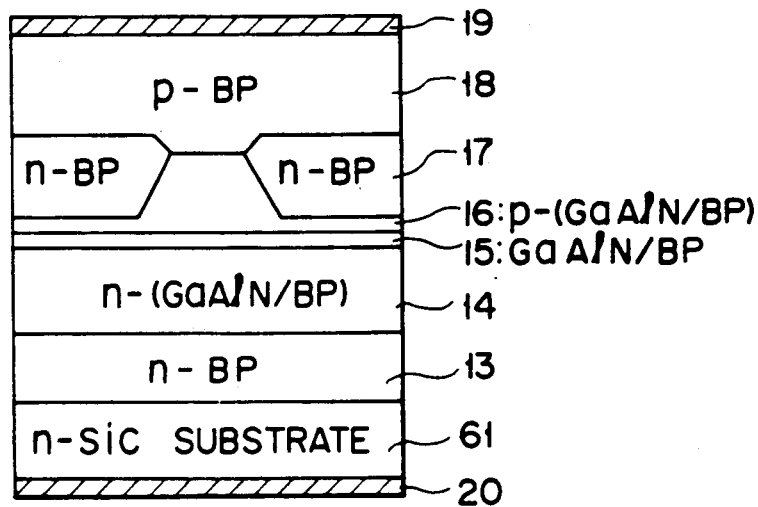
FIG. 7 is a sectional view showing a semiconductor laser according to still another embodiment using an SiC substrate.

FIG. 7 shows still another embodiment of the present invention. This embodiment has the same arrangement as that of the embodiment shown in FIG. 3 except that an SiC substrate having a lattice constant closer to that of the material of the double heterojunction portion is used in a portion of the GaP substrate 11 and the GaP buffer layer 12.

In the above embodiment, stress concentration on the double heterojunction portion or occurrence of a dislocation can be prevented. In addition, in each of the above embodiments, a suitable temperature cycle may be effectively given during formation of the BP buffer layer 12 to absorb the stress. Further, it is possible to grow a thick BP layer on a substrate, followed by removing the substrate. Still further, it is possible to off-cut Si so as to provide a suitable substrate.

In the above embodiments, the BP layer is used as the current blocking layer. The BP layer, however, is opaque with respect to a light emission wavelength to cause a large loss, thereby increasing a threshold current density. In addition, an astigmatism is increased when a high output is required. Furthermore, it is important that the carrier concentration of the current blocking layer is sufficiently high. Since, however, it is difficult to perform n-type high-concentration doping in the BP layer, no sufficiently high carrier concentration can be obtained. These problems can be solved by using a WZ type crystal as the current blocking layer.

Figure 8:
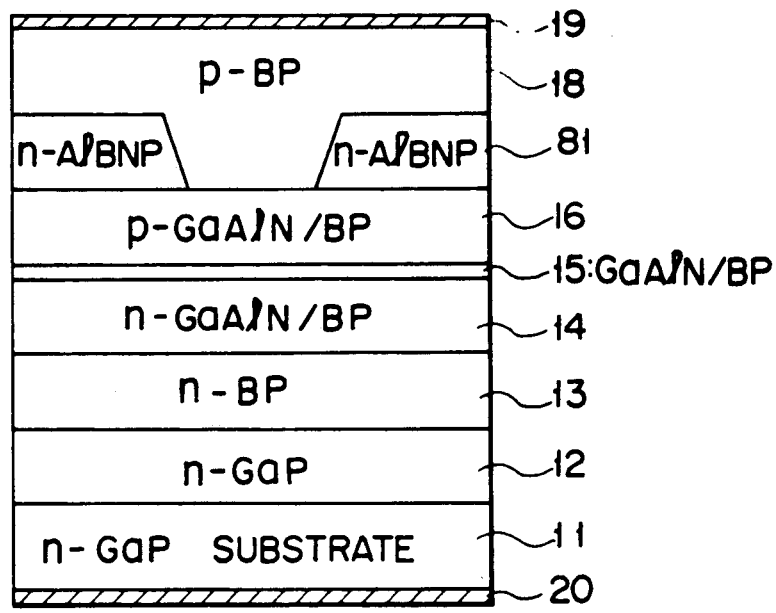

FIG. 8 shows a semiconductor laser according to still another embodiment of the present invention as described above. This embodiment has the same arrangement as that of the embodiment shown in FIG. 1 except that a portion of the n-type BP current blocking layer 17 is substituted by an n-type $Ga_xAl_yB_{l-x-y}N_zP_{l-z}$ ($0 \leq x, y, z \leq 1$) current blocking layer 81. A device was formed by growing an Si-doped $Al_{0.2}B_{0.8}N_{0.2}P_{0.8}$ layer having a carrier concentration of $1 \times 10^{18}/cm^3$ and a thickness of 1 μm as the n-type $Ga_xAl_yB_{l-x-y}N_zP_{l-z}$ current blocking layer 81.

When the cavity length of the obtained laser device was 300 μm, green laser oscillation was confirmed by a pulse operation having a pulse width of the 100 μsec at a liquid nitrogen temperature. The threshold current density of laser oscillation was about 30 kA/cm². An operation voltage was as low as about 5 V.

Figure 9:
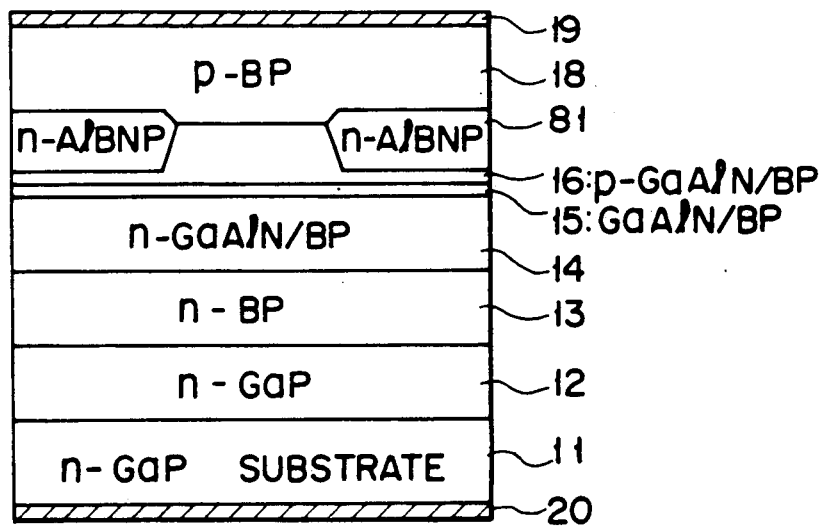

In other embodiments shown in FIGS. 9 and 10, a similar $Al_xB_{l-x}N_yP_{l-y}$ current blocking layer 81 is applied to the embodiments shown in FIGS. 3 and 4. The similar effects can be obtained by these embodiments. In addition, the similar effects can be obtained by mixing Ga in WZ type $Al_xB_{l-x}N_yP_{l-y}$.

Still another embodiment in which a WZ type $Ga_uAl_{l-u}N$ layer ($0 \leq u \leq 1$) is used as the current blocking layer will be described below. The WZ type $Ga_uAl_{l-u}N$ has a high transparency, and its crystal can be easily grown at a high rate. Therefore, in the semiconductor laser of the present invention, the WZ type $Ga_uAl_{l-u}N$ is very effective as the current blocking layer.

FIG. 11 shows still another embodiment of the present invention as described above in which a portion of the n-type BP current blocking layer 17 of the embodiment shown in FIG. 1 is substituted by an n-type GaN current blocking layer 91. Manufacturing steps of this embodiment are basically the same as those of the embodiment shown in FIG. 1. More specifically, an Si-doped GaN layer having a carrier concentration of $1\times10^{18}/cm^3$ and a thickness of 1 μm is used as the current blocking layer 91 to form a laser device having a cavity length of 300 μm. Green laser oscillation was confirmed by a pulse operation of the obtained laser device having a pulse width of 100 μsec at a liquid nitrogen temperature. The threshold current density of laser oscillation was about 30 kA/cm². In addition, it was confirmed that good transverse mode control was performed, and an operation voltage was as low as about 5 V. Furthermore, an astigmatism was 10 μm which is much smaller than 30 μm obtained when BP was used as the current blocking layer.

Figure 12:
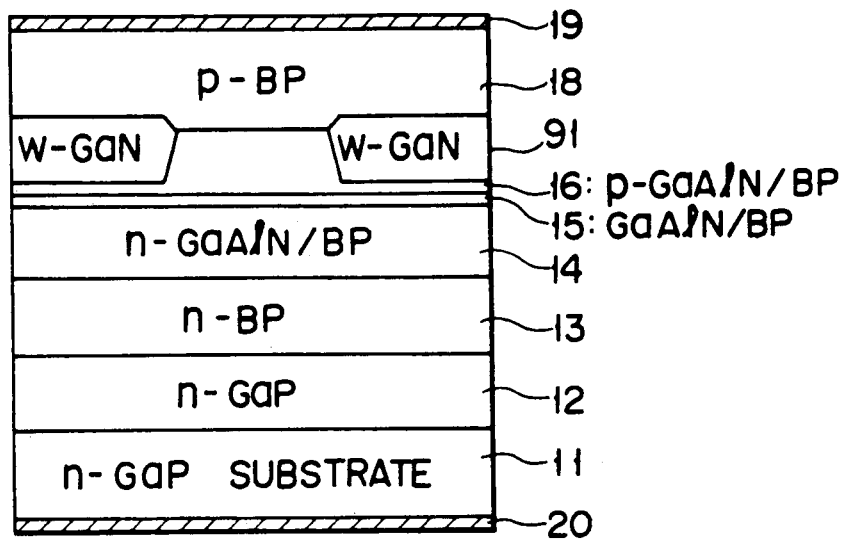
Figure 13:
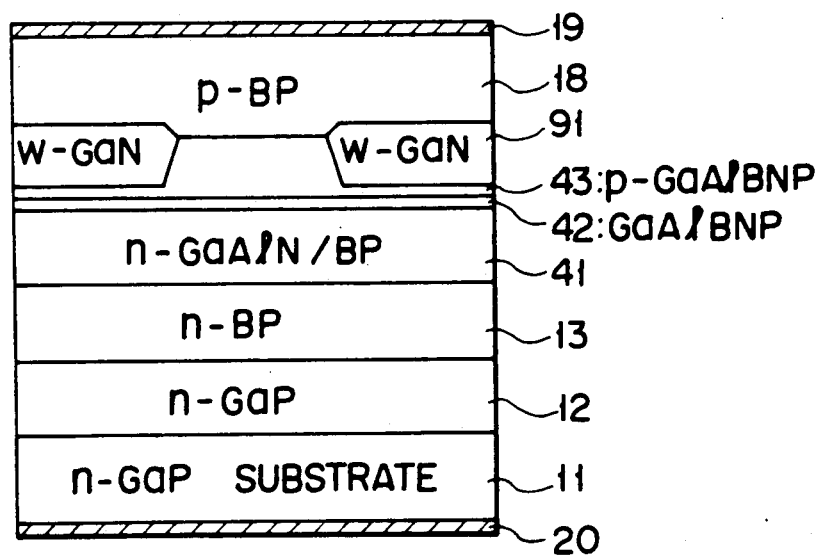

FIGS. 12 and 13 show other embodiments in which the n-type GaN current blocking layer 91 is applied to the arrangements of the embodiments shown in FIGS. 3 and 4, respectively. The same effects can be obtained by these embodiments.

A $Ga_xAl_{l-x}N/BP$ superlattice layer or a $Ga_xAl_yB_{l-x-y}N_zP_{l-z}$ mixed crystal layer can be used as the current blocking layer.

In the above embodiments, the first and second clad layers consisting of a $Ga_xAl_{l-x}N/BP$ superlattice layer or a $Ga_xAl_yB_{l-x-y}N_zP_{l-z}$ mixed crystal layer are arranged such that the upper second clad layer is brought into contact with the BP contact layer and the lower first clad layer is brought into contact with the BP buffer layer. Since the BP layer has a narrower band gap than that of the $Ga_xAl_{l-x}N/BP$ superlattice layer or the $Ga_xAl_yB_{l-x-y}N_zP_{l-z}$ mixed crystal layer, a potential barrier is formed between the two layers. This potential barrier increases the laser oscillation threshold current density or the operation voltage of the device. Therefore, it is effective to form an intermediate buffer layer for smoothly transiting the band gap between the two layers. An embodiment of this type will be described below.

Figure 14:
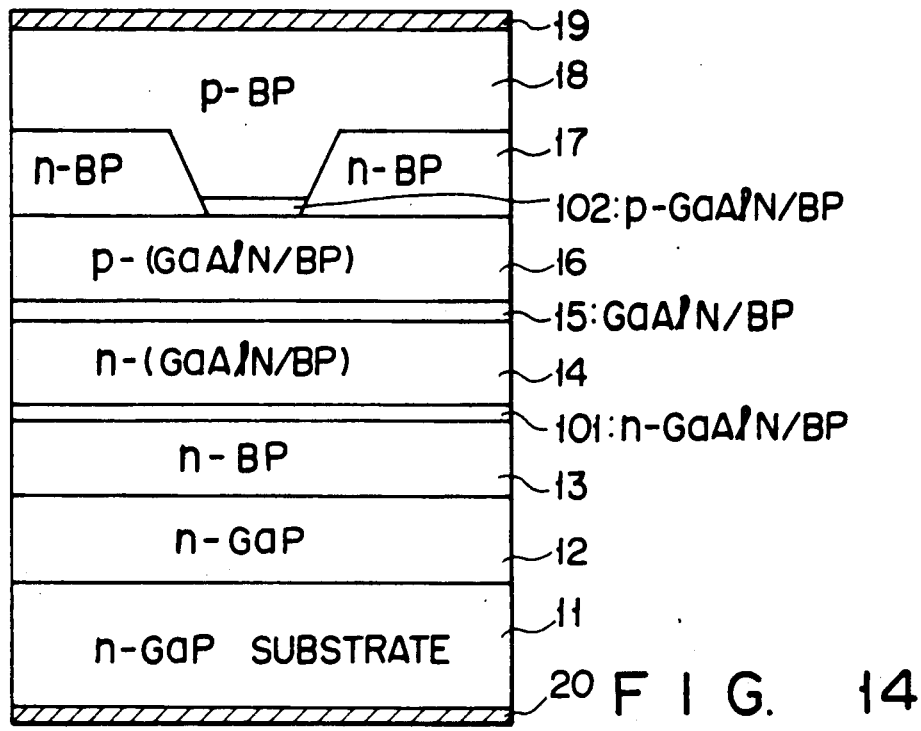

FIG. 14 is a semiconductor laser according to still another embodiment of the present invention as described above. This embodiment has substantially the same arrangement as that of the embodiment shown in FIG. 1 except that a first intermediate buffer layer 101 consisting of an n-type $Ga_xAl_{l-x}N/BP$ superlattice layer is formed between an n-type BP buffer layer 13 and a first clad layer 14 consisting of an n-type $Ga_xAl_{l-x}N/BP$ superlattice layer, and a second intermediate buffer layer 102 consisting of a p-type $Ga_xAl_{l-x}N/BP$ superlattice layer is similarly formed between a second clad layer 16 consisting of a p-type $Ga_xAl_{l-x}N/BP$ superlattice layer and a p-type BP contact layer 18.

A device manufacturing method and manufacturing conditions are basically the same as those of the embodiment shown in FIG. 1. More specifically, when the first clad layer 14 is an Si-doped $Ga_{0.4}Al_{0.6}N/BP$ layer having a carrier concentration of $1\times10^{17}/cm^3$, the first intermediate buffer layer 101 is an Si-doped $Ga_{0.8}Al_{0.2}N/BP$ superlattice layer having a carrier concentration of $1\times10^{17}/cm^3$ and a thickness of 0.1 μm. When the second clad layer 14 is an Mg-doped $Ga_{0.4}Al_{0.6}N/BP$ layer having a carrier concentration of $1\times10^{17}/cm^3$, the second intermediate buffer layer 102 is an Mg-doped $Ga_{0.8}Al_{0.2}N/BP$ superlattice.

Also in the device of this embodiment, green laser oscillation was confirmed at a liquid nitrogen temperature, and a low threshold current density and a low operation voltage were obtained.

Figure 15:
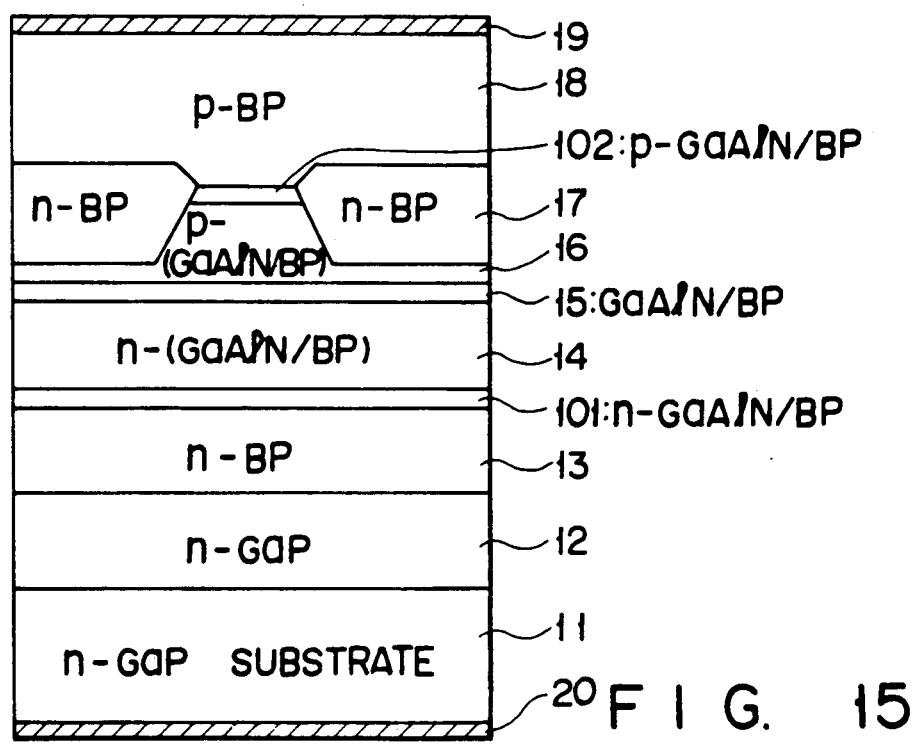
Figure 18:
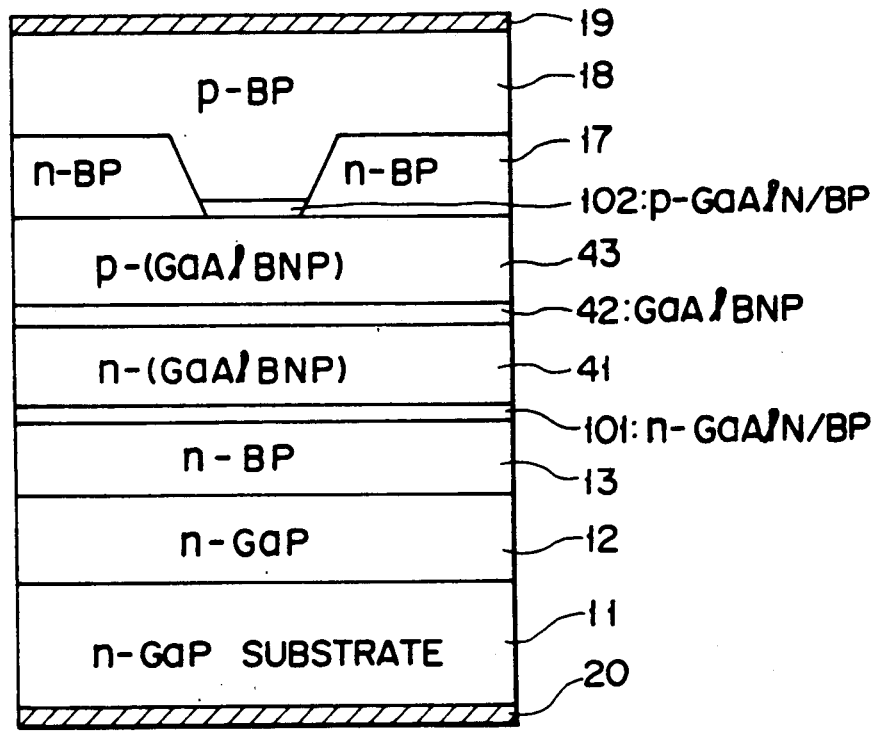
Figure 19:
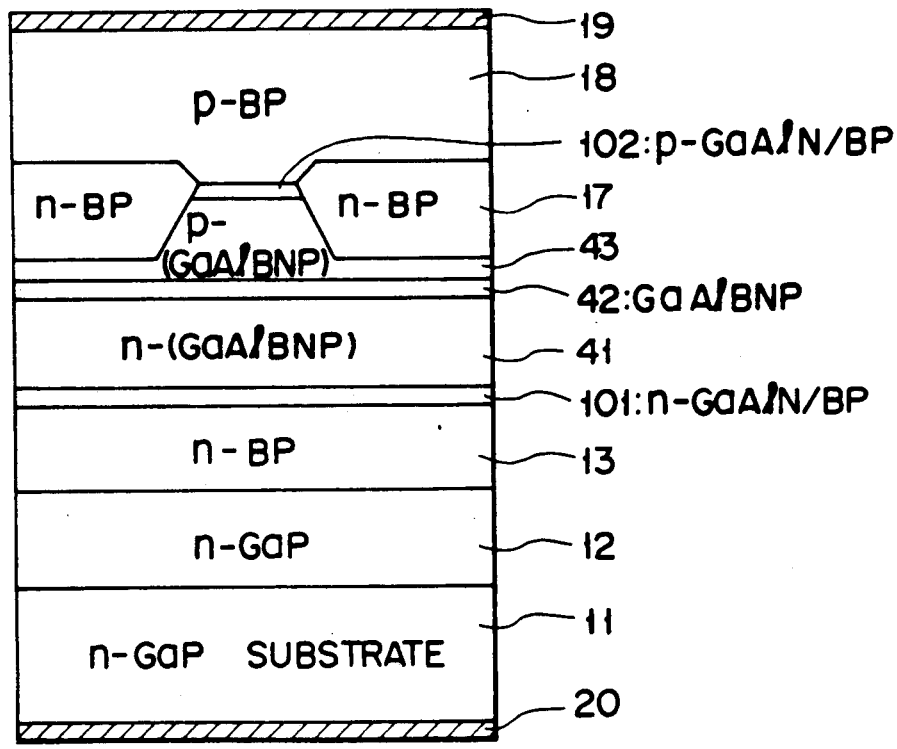

FIG. 15 shows still another embodiment of the present invention in which intermediate buffer layers 101 and 102 consisting of the same superlattice layers as those of the embodiment shown in FIG. 14 is applied to the device of the embodiment shown in FIG. 3. Also in this embodiment, similar green laser oscillation can be obtained.

FIGS. 16 and 17 show other embodiments in which portions of the intermediate buffer layers 101 and 102 in FIGS. 14 and 15 are substituted by intermediate buffer layers 111 and 112 each consisting of a $Ga_xAl_yB_{l-x-y}N_zP_{l-z}$ mixed crystal layer, respectively.

The above methods of forming an intermediate buffer layer are naturally effective when a $Ga_xAl_yB_{l-x-y}N_zP_{l-z}$ mixed crystal layer is used as the clad layer and the active layer. In this case, a $Ga_xAl_{l-x}N/BP$ superlattice layer or a $Ga_xAl_yB_{l-x-y}N_zP_{l-z}$ mixed crystal layer may be used as the intermediate buffer layer.

FIGS. 18 to 21 show other embodiments in which intermediate buffer layers corresponding to those shown in FIGS. 14 to 17, respectively, are formed when a mixed crystal layer is used as a clad layer and an active layer. More specifically, in each of the embodiments shown in FIGS. 20 and 21, when an n-type clad layer 41 and a p-type clad layer 43 are $Ga_{0.2}Al_{0.3}B_{0.5}N_{0.5}P_{0.5}$ mixed crystal layers, a first intermediate buffer layer 111 is an Si-doped $Ga_{0.4}Al_{0.1}B_{0.5}N_{0.5}P_{0.5}$ mixed crystal layer having a carrier concentration of $1\times10^{17}/cm^3$ and a thickness of 0.1 μm, and a second intermediate buffer layer 112 is an Mg-doped $Ga_{0.4}Al_{0.1}B_{0.5}N_{0.5}P_{0.5}$ mixed crystal layer having a carrier concentration of $1\times10^{17}/cm^3$ and a thickness of 0.1 μm. A device manufacturing method is basically the same as the embodiment shown in FIG. 4.

By these embodiments, the same effects as those of the above embodiments can be obtained.

In each of the above embodiments in which the intermediate layers are formed in order to obtain a smooth band gap change, the second intermediate buffer layer at the contact layer side is formed on only a current blocking region. The second intermediate buffer layer, however, can be formed on the entire surface of the clad layer.

FIGS. 22 and 23 show other embodiments as described above. FIG. 22 shows a modification of the embodiment shown in FIG. 14, in which an upper intermediate buffer layer 102 is formed on the entire surface of a second clad layer 16. FIG. 23 shows a modification of the embodiment shown in FIG. 18, in which an upper intermediate buffer layer 112 is formed on the entire surface of a second clad layer 16. A similar modification can be performed for the device shown in FIG. 16 or 20.

In each of the above embodiments, regardless of whether a superlattice layer or a mixed crystal layer is used as the intermediate buffer layer, its average composition is preferably changed in the film thickness direction. As a result, a band gap of the intermediate buffer layer continuously changes to effectively smooth a transition region of the band gap.

As has been described above, the semiconductor laser of the present invention has a problem in that no suitable substrate with high quality for obtaining lattice alignment is available. In order to solve this problem, a method of removing a substrate used in crystal growth after the crystal growth is also effective in addition to the method of forming a buffer layer having the same quality as a light-emitting layer described in the above embodiments.

FIG. 24 shows a semiconductor laser according to still another embodiment of this type. The semiconductor laser of this embodiment is formed in substantially the same manner as for the device of the embodiment shown in FIG. 1, and then a substrate 11 and a GaP buffer layer 12 are removed. Removal of the GaP substrate 11 and the GaP buffer layer 12 is performed by, e.g., executing etching using 2% bromine methylalcohol solution after mechanical polishing.

According to this embodiment, since the substrate and the buffer layer are removed, stress concentration on a light-emitting layer is reduced to realize a stable operation. More specifically, when a device having a cavity length of 300 μm was formed in accordance with this embodiment, green laser oscillation was confirmed by a pulse operation having a pulse width of 100 μsec at a liquid nitrogen temperature. The threshold current density of laser oscillation was about 50 kA/cm$^2$. Although no laser oscillation was confirmed at room temperature, stable light emission was confirmed for 100 hours or more by an LED mode operation.

Figure 26:
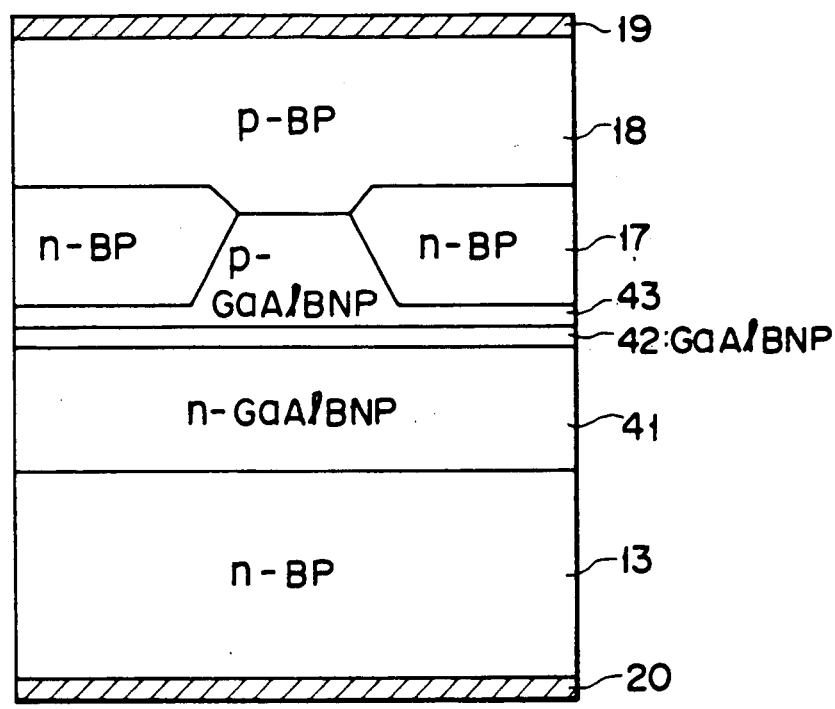

FIGS. 25 and 26 show other embodiments in which similar substrate removal is performed for the devices according to the embodiments shown in FIGS. 3 and 4, respectively. The same effects can be obtained by these embodiments.

In each of the above embodiments, a p-n junction is used to form a current blocking layer for performing current blocking. Current blocking, however, can be performed without forming such a special current blocking layer. Still another embodiment of the present invention of this type will be described below.

FIG. 27 shows a semiconductor laser according to such an embodiment. This embodiment has the same structure as that of the embodiment shown in FIG. 17 except that a p-type BP contact layer 18 is formed without forming an n-type BP current blocking layer 17. According to this method, since no selective growth step is required, manufacturing steps are simplified to lead to cost reduction.

In this structure, no current flows through a region in which a p-type second clad layer 16 and the p-type BP contact layer 18 are directly brought into contact with each other due to a large potential barrier caused by band discontinuity. Since a central stripe portion in which an intermediate buffer layer 102 consisting of a p-type $Ga_xAl_{1-x}N$/BP superlattice layer is formed has smooth band transition, a current flows therethrough. Therefore, also in this structure, current blocking is substantially performed. In addition, since the second clad layer 16 is formed to have a stripe-like projecting portion, a refractive index difference is formed in the transverse direction to achieve an optical confinement effect.

When a device having a cavity length of 300 μm was formed in accordance with this embodiment, green laser oscillation was confirmed by a pulse operation having a pulse width of 100 μsec at a liquid nitrogen temperature. The threshold current density of laser oscillation was about 70 kA/cm$^2$. Although the threshold current density was high, it was confirmed that good transverse mode control was performed. An operation voltage was as low as about 5 V.

FIG. 28 shows still another embodiment in which a similar current blocking structure is applied to the device of the embodiment shown in FIG. 21. Similar laser oscillation can also be performed by this embodiment. In addition, a similar current blocking structure can be applied to the device shown in FIG. 15 or 19.

Figure 29:
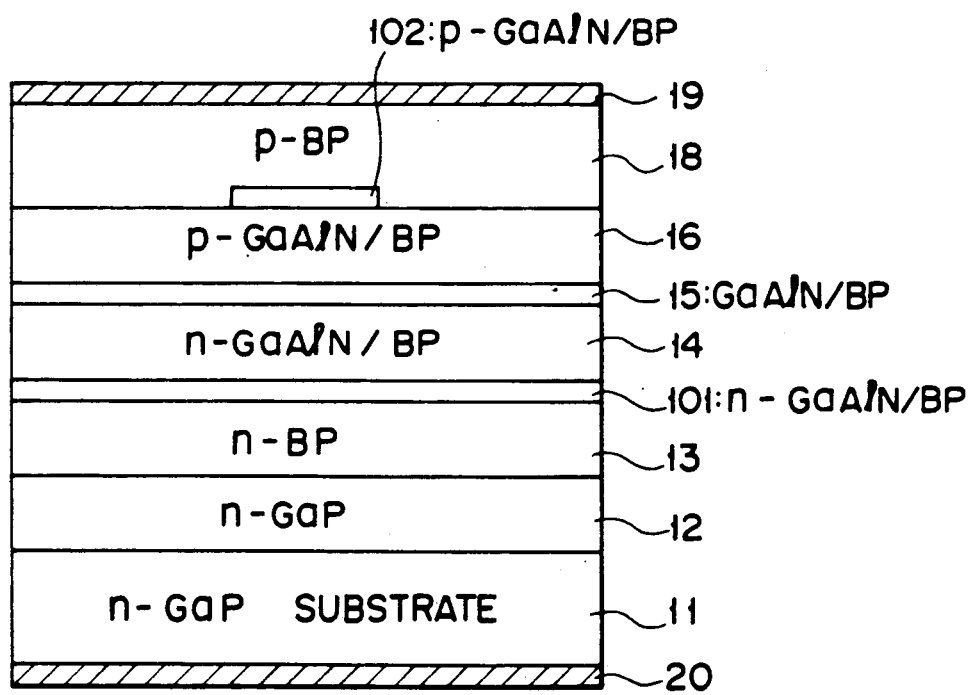

FIG. 29 shows still another embodiment in which a p-type second clad layer 16 is not formed to have a stripe-like projecting portion. A p-type $Ga_xAl_{1-x}N$/BP intermediate buffer layer 102 formed on the second clad layer 16 is selectively etched and patterned to have stripes, and a p-type BP contact layer 19 is formed on the entire surface of the layer 102. Also in this embodiment, current blocking is performed and laser oscillation can be performed although no optical confinement effect is obtained. Although not shown, a similar current blocking structure can be applied to a device in which a mixed crystal layer is used in a double heterojunction portion or an intermediate buffer layer.

The compound semiconductor material for use in a light-emitting layer in a semiconductor laser of the present invention has poor ionicity and a ZB structure of BP and a wide band gap of $Ga_xAl_{1-x}N$. Since, however, the material has a self-compensation effect in which N is removed when an acceptor impurity is doped in a $Ga_xAl_{1-x}N$ layer, it is difficult to perform high-concentration p-type doping. In order to solve this problem, it was found that an impurity can be effectively, selectively doped in only a BP layer having poor ionicity upon formation of a p-type $Ga_xAl_{1-x}N$/BP superlattice layer. When a p-type impurity is doped in the entire $Ga_xAl_{1-x}N$/BP superlattice layer, many defects occur in addition to the self-compensation effect in the $Ga_xAl_{1-x}N$ layer. As a result, a high carrier concentration cannot be obtained as a whole. To the contrary, when a p-type impurity is selectively doped in only a BP layer, no self-compensation effect or defect occur. As a result, many doped impurity components are effectively activated as carriers.

Figure 30A:
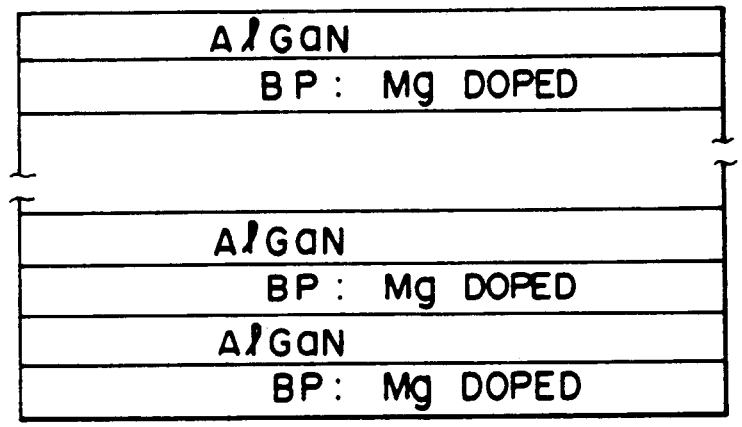
FIGS. 30A and 30B are views each for explaining a selective doping method effective in the present invention.
Figure 30B:
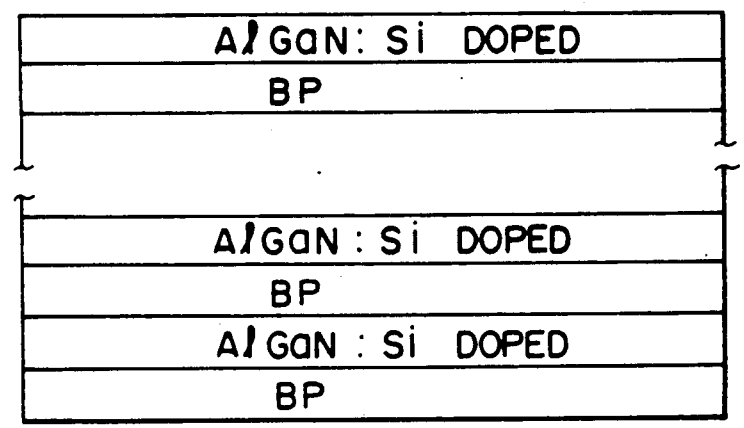

FIGS. 30A and 30B are schematic views for explaining doping methods of this type. FIG. 30A shows a p-type doping method, while FIG. 30B shows an n-type doping method. In each method, a superlattice structure in which a BP layer and a $Ga_xAl_{1-x}N$ layer are alternately stacked every predetermined period is basically used. In FIG. 30A, however, Mg is doped in only the BP layer, while Si is doped in only the $Ga_xAl_{1-x}N$ layer in FIG. 30B.

Growth of a superlattice structure semiconductor layer and selective impurity doping as described above can be performed by the MOCVD apparatus shown in FIG. 2. When the $Ga_xAl_{1-x}N$/BP superlattice layer is to be formed under the same conditions as for superlattice layer formation in each of the above embodiments, Si is doped upon formation of a $Ga_xAl_{1-x}N$ layer in the case of an n-type, and Mg is doped upon formation of a BP layer in the case of a p-type. In the case of an n-type, Si can be simultaneously doped in the $Ga_xAl_{1-x}N$ layer and the BP layer. Since, however, BP has a very high effective mass, it is not suitable for n-type doping. It was confirmed that a superlattice semiconductor film having a carrier concentration on the order of $10^{18}$/cm$^3$ can be obtained for both p- and n-types by this selective doping. Therefore, this selective doping is effective in the manufacture of the semiconductor laser of the present invention.

Note that upon p-type doping, Mg may be slightly mixed in the $Ga_xAl_{1-x}N$ layer.

The present invention is not limited to the above embodiments. In the above embodiments, in order to form a double heterojunction by using a $Ga_x$-

$Al_{l-x}N/BP$ superlattice layer, its composition ratio is changed. In addition, when a $Ga_xAl_yB_{l-x-y}N_zP_{l-z}$ mixed crystal layer is used, its average composition is changed. When a $Ga_xAl_{l-x}N/BP$ superlattice layer is used, a band gap can be changed by changing a film thickness ratio between the $Ga_xAl_{l-x}N$ layer and the BP layer. This can be similarly performed in order to change the band gap in an intermediate buffer layer. In each of the above embodiments, although $x+y=0.5$ is set when the average composition is represented by $Ga_xAl_yB_{l-x-y}N_zP_{l-z}$ including the superlattice structure, another composition may be used in the present invention. In the case of a light-emitting layer, however, if $x+y$ is smaller than 0.5, a band structure undesirably changes from a direct transition type to an indirect transition type.

In each of the above embodiments, a small amount of, e.g., In can be mixed as a Group III element in addition to B, Ga, and Al in order to improve lattice alignment between the $Ga_xAl_{l-x}N$ layer and the BP layer. Similarly, As and Sb can be mixed as a Group V element. In addition, as a source gas, triethylgallium (TEG), triethylaluminum (TEA), and trimethylboron (TMB) can be used as Ga, Al, and B sources, respectively. As the N source, an organic metal compound called an adduct such as $Ga(C_2H_5)_3.NH_3$, and $Ga(CH_3)_3.N.(CH_3)_3$ can be used in addition to hydrazine ($N_2H_4$). The Mg materials used in the present invention include, for example, octamethyl dialuminum monomagnesium, $Mg[Al(CH_3)_4]_2$, pentamethylaluminum magnesium, $MgAl(CH_3)_5$, isopropyl cyclopentadienyl magnesium, $(i-C_3H_8)_2Cp_2Mg$, dimethyl cyclopentadienyl magnesium, $[(CH_3)_2Cp]_2Mg$, acetylacetone magnesium, $(C_5H_7O_2)_2Mg$, and dipivaloylmethyl magnesium, $(C_{11}H_9O_2)_2Mg$. Furthermore, in the above embodiments, a first conductivity type is an n type and a second conductivity type is a p type. This relationship, however, may be reversed. Moreover, another material can be selected for the electrodes. Further, additional substrate materials can be used including, for example, those having a crystal structure of tetragonal system such as $TiO_2$ or sodium chloride type such as MnO.

As has been described above, according to the present invention, a new five-element compound semiconductor material having a wide band gap and a ZB structure can be used to provide a practical green-light semiconductor laser.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. In a semiconductor laser comprising:
   a substrate;
   a first clad layer, of a first conductivity type, formed on said substrate and constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure;
   an active layer formed on said first clad layer and constituted by a superlattice layer wherein BP layers and $Ga_xAl_{l-x}N$ ($0 \leq x \leq 1$) layers are alternately stacked on each of said $Ga_xAl_{l-x}N$ ($0 \leq x \leq 1$) layers has a zinc blende type crystal structure; and
   a second clad layer, of a second conductivity type, formed on said active layer and constituted by a superlattice layer wherein BP layers and $Ga_xAl_{l-x}N$ ($0 \leq x \leq 1$) layers are alternately stacked and each of said $Ga_xAl_{l-x}N$ ($1 \leq x \leq 1$) layers has a zinc blende type crystal structure.

2. In a semiconductor laser comprising:
   a substrate;
   a first clad layer, of a first conductivity type, formed on said substrate via a buffer layer and constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure;
   an active layer formed on said first clad layer and constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure; and
   a second clad layer, of a second conductivity type, formed on said active layer and constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure.

3. A laser according to claim 2, wherein one of the composition of each of said $Ga_xAl_{l-x}N$ ($0 \leq x \leq 1$) layers constituting said superlattice and the film thickness ratio of said $Ga_xAl_{l-x}N$ ($0 \leq x \leq 1$) layer to said BP layer of said active layer is set to be different from those of said first and second clad layers, and said active layer has a narrower band gap than that of said first and second clad layers.

4. A laser according to claim 2, wherein a current blocking layer of the first conductivity type, consisting of one of a $Ga_uAl_{l-u}N$ ($0 \leq u \leq 1$) layer and a BP layer, is selectively formed on one of said second clad layer and a region from which said second clad layer has been partially removed.

5. A laser according to claim 2, wherein a current blocking layer of the first conductivity type, consisting of one of a $Ga_uAl_{l-u}N$ ($0 \leq u \leq 1$) layer and a BP layer, is selectively formed on one side of said second clad layer and a region from which said second clad layer has been partially removed, and a contact layer of the second conductivity type, consisting of a BP layer, is formed on said current blocking layer and said second clad layer.

6. A laser according to claim 5, further comprising an intermediate buffer layer, formed at least under said first clad layer or on said second clad layer, for smoothly changing a band gap of a region between the active layer and one of the first and second clad layer.

7. A laser according to claim 6 wherein said intermediate buffer layer is constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure, and one of the composition of each of said $Ga_xAl_{l-x}N$ layers and the film thickness ratio of said $Ga_xAl_{l-x}N$ layers to said BP layer changes in a film thickness direction.

8. A laser according to claim 6, wherein said intermediate buffer layer consists of a multilayered structure of $Ga_xAl_yB_{l-x-y}N_zP_{l-z}$ ($0 \leq x, y, z \leq 1$), and the average composition of said intermediate buffer layer continuously changes in a film thickness direction.

9. In a semiconductor laser comprising:
a substrate;
a first clad layer, of a first conductivity type, formed on said substrate and consisting of a $Ga_xAl_yB_{l-x-y}N_zP_{l-z}$ ($0 \leq x, y, z \leq 1$) mixed crystal layer having a zinc blende type crystal structure;
an active layer formed on said first clad layer and consisting of a $Ga_xAl_yB_{l-x-y}N_zP_{l-z}$ ($0 \leq x, y, z \leq 1$) mixed crystal layer having a zinc blende type crystal structure; and
a second clad layer, of a second conductivity type, formed on said active layer and consisting of a $Ga_xAl_yB_{l-x-y}N_zP_{l-z}$ ($1 \leq x, y, z \leq 1$) mixed crystal layer having a blende type crystal structure.

10. In a semiconductor laser comprising:
a substrate;
a first clad layer, of a first conductivity type, formed on said substrate via a buffer layer and consisting of a $Ga_xAl_yB_{l-x-y}N_zP_{l-z}$ ($0 \leq x, y, z \leq 1$) mixed crystal layer having a zinc blende type crystal structure;
an active layer formed on said first clad layer and consisting of a $Ga_xAl_yB_{l-x-y}N_zP_{l-z}$ ($0 \leq x, y, z \leq 1$) mixed crystal layer having a zinc blende type crystal structure; and
a second clad layer, of a second conductivity type formed on said active layer and consisting of a $Ga_xAl_yB_{l-x-y}N_zP_{l-z}$ ($0 \leq x, y, z \leq 1$) mixed crystal layer having a zinc blende type crystal structure.

11. A laser according to claim 10, wherein the average composition of said $Ga_xAl_yB_{l-x-y}N_zP_{l-z}$ ($0 \leq x, y, z \leq 1$) of said active layer is set to be different from that of said first and second clad layers, and said active layer has a narrower band gap than that of said first and second clad layers.

12. A laser according to claim 10 wherein a current blocking layer of the first conductivity type, consisting of one of a $Ga_uAl_{l-u}N$ ($0 \leq u \leq 1$) layer and a BP layer, is selectively formed on said second clad layer and a region from which said second clad layer has been partially removed.

13. A laser according to claim 10, wherein a current blocking layer of the first conductivity type, consisting of one of a $Ga_uAl_{l-u}N$ ($0 \leq u \leq 1$) layer and a BP layer, is selectively formed on one of said second clad layer and a region from which said second clad layer has been partially removed, and a contact layer of the second conductivity type, consisting of a BP layer, is formed on said current blocking layer and said second clad layer.

14. A laser according to claim 13 further comprising an intermediate buffer layer, formed at least under said first clad layer or on said second clad layer, for smoothly changing a band gap of a region between the active layer and the first clad layer.

15. A laser according to claim 14 wherein said intermediate laser is constituted by a superlattice layer wherein BP layers and $Ga_xAl_{l-x}N$ ($0 \leq x \leq 1$) layers are alternately stacked and each of said $Ga_xAl_{l-x}N$ ($0 \leq x \leq 1$) layers has a zinc blende type crystal structure, and one of the composition of each of said $Ga_xAl_{l-x}N$ layers and the film thickness ratio of said $Ga_xAl_{l-x}N$ layers to said BP layer changes in a film thickness direction.

16. A laser according to claim 14 wherein said intermediate buffer layer consists of one of a single-layered and a multilayered structure of $Ga_xAl_yB_{l-x-y}N_zP_{l-z}$ ($0 \leq x, y, z \leq 1$), and the average composition of said intermediate buffer layer, consisting of the multilayered structure, continuously changes in a film thickness direction.

* * * * *